(12) United States Patent
Tsai et al.

(10) Patent No.: US 12,532,440 B2
(45) Date of Patent: Jan. 20, 2026

(54) HEAT DISSIPATION STRUCTURE AND POWER MODULE

(71) Applicant: ACTRON TECHNOLOGY CORPORATION, Taoyuan (TW)

(72) Inventors: Hsin-Chang Tsai, Taoyuan (TW); Ching-Wen Liu, Taoyuan (TW)

(73) Assignee: ACTRON TECHNOLOGY CORPORATION, Taoyuan (TW)

( * ) Notice: Subject to any disclaimer, the term of this patent is extended or adjusted under 35 U.S.C. 154(b) by 449 days.

(21) Appl. No.: 18/179,363

(22) Filed: Mar. 7, 2023

(65) Prior Publication Data

US 2024/0274494 A1 Aug. 15, 2024

(30) Foreign Application Priority Data

Feb. 9, 2023 (TW) .................................. 112104557

(51) Int. Cl.
*H05K 7/20* (2006.01)
*H01L 23/367* (2006.01)
*H01L 23/373* (2006.01)

(52) U.S. Cl.
CPC .......... *H05K 7/209* (2013.01); *H01L 23/3677* (2013.01); *H01L 23/3735* (2013.01); *H05K 7/20509* (2013.01)

(58) Field of Classification Search
CPC .... H05K 7/209–20927; H05K 7/20509; H01L 23/3672; H01L 23/3677; H01L 23/3735; H01L 23/473
See application file for complete search history.

(56) References Cited

U.S. PATENT DOCUMENTS

| 5,602,720 | A | * | 2/1997 | Natsuhara | ........... H01L 23/3735 361/708 |
| 6,830,960 | B2 | | 12/2004 | Alcoe et al. | |
| 12,074,532 | B2 | * | 8/2024 | Lida | ........................ H02M 7/48 |
| 2008/0079145 | A1 | | 4/2008 | Tschirbs et al. | |
| 2011/0298121 | A1 | | 12/2011 | Nishibori et al. | |
| 2022/0157696 | A1 | | 5/2022 | Yao et al. | |

FOREIGN PATENT DOCUMENTS

| AT | 14114 | 4/2015 |
| CN | 109246982 | 1/2019 |
| CN | 218274574 | 1/2023 |
| DE | 102006045939 | 4/2008 |

(Continued)

OTHER PUBLICATIONS

"Office Action of Germany Counterpart Application", issued on Oct. 20, 2023, pp. 1-8.

(Continued)

*Primary Examiner* — Zachary Pape
(74) *Attorney, Agent, or Firm* — JCIPRNET

(57) ABSTRACT

A heat dissipation structure includes a substrate and an annular groove. The substrate has an upper surface and a lower surface opposite to each other. The annular groove is configured on the upper surface of the substrate to divide the substrate into a configuration area and a periphery area. The annular groove is located between the configuration area and the periphery area. A depth of the annular groove is less than or equal to half of a thickness of the substrate.

6 Claims, 6 Drawing Sheets

(56) References Cited

FOREIGN PATENT DOCUMENTS

| DE | 102011076886 | 12/2011 |
|----|--------------|---------|
| JP | S5389167     | 7/1978  |
| JP | 2017126681   | 7/2017  |
| JP | 2018152465   | 9/2018  |

OTHER PUBLICATIONS

"Office Action of France Counterpart Application", issued on Mar. 17, 2025, p. 1-p. 9.
"Office Action of Japan Counterpart Application", issued on Aug. 23, 2024, p. 1-p. 7.
"Office Action of Taiwan Counterpart Application", issued on Feb. 29, 2024, pp. 1-5.
"Office Action of Taiwan Counterpart Application", issued on Nov. 26, 2024, pp. 1-7.

* cited by examiner

HEAT DISSIPATION STRUCTURE AND POWER MODULE

CROSS-REFERENCE TO RELATED APPLICATION

This application claims the priority benefit of Taiwan application serial no. 112104557, filed on Feb. 9, 2023. The entirety of the above-mentioned patent application is hereby incorporated by reference herein and made a part of this specification.

BACKGROUND

Technical Field

The disclosure relates to a heat dissipation structure and a power module, and in particular, to a heat dissipation structure capable of avoiding warpage during reflow and a power module adopting the heat dissipation structure.

Description of Related Art

Power modules are currently used in various products as the main core equipment for power conversion, and power components are packaged therein. When the heat dissipation substrate in the power module is connected with the direct copper-clad ceramic substrate (DBC) chip circuit board, due to the different thermal expansion coefficients of each material, the amount of thermal deformation caused by dropping from high temperature to low temperature during reflow is also different., thereby causing warping of the heat dissipation substrate and affecting the overall structural reliability.

SUMMARY

The disclosure provides a heat dissipation structure which may reduce warpage during reflow.

The disclosure also provides a power module including the above-mentioned heat dissipation structure, which may effectively reduce warpage of the overall structure and improve structural reliability.

The heat dissipation structure of the disclosure includes a substrate and an annular groove. The substrate has an upper surface and a lower surface opposite to each other. The annular groove is configured on the upper surface of the substrate to divide the substrate into a configuration area and a periphery area. The annular groove is located between the configuration area and the periphery area. A depth of the annular groove is less than or equal to half of a thickness of the substrate.

In an embodiment of the disclosure, the above-mentioned heat dissipation structure further includes multiple heat dissipation fins separately configured on the lower surface of the substrate.

In an embodiment of the disclosure, the above-mentioned heat dissipation structure further includes multiple first auxiliary grooves communicating with the annular groove to divide the configuration area into at least three sub-configuration areas.

In an embodiment of the disclosure, the above-mentioned heat dissipation structure further includes multiple second auxiliary grooves communicating with the annular groove and respectively extending to four corners of the periphery area.

In an embodiment of the disclosure, the depth of the above-mentioned annular groove is between 5% and 50% of the thickness of the substrate.

The power module of the disclosure includes a heat dissipation structure, multiple laminate substrates, and multiple chips. The heat dissipation structure includes a substrate and an annular groove. The substrate has an upper surface and a lower surface opposite to each other. The annular groove is configured on the upper surface of the substrate to divide the substrate into a configuration area and a periphery area. The annular groove is located between the configuration area and the periphery area. A depth of the annular groove is less than or equal to half of a thickness of the substrate. The laminate substrate is configured on the heat dissipation structure and is located in the configuration area of the substrate. The chips are respectively configured on the laminate substrates and electrically connected with the laminate substrates, respectively.

In an embodiment of the disclosure, the above-mentioned heat dissipation structure further includes multiple heat dissipation fins separately configured on the lower surface of the substrate.

In an embodiment of the disclosure, the above-mentioned heat dissipation structure further includes multiple first auxiliary grooves communicating with the annular groove to divide the configuration area into at least three sub-configuration areas, and the laminate substrates are respectively disposed corresponding to the sub-configuration areas.

In an embodiment of the disclosure, the above-mentioned heat dissipation structure further includes multiple second auxiliary grooves communicating with the annular groove and respectively extending to four corners of the periphery area.

In an embodiment of the disclosure, the depth of the above-mentioned annular groove is between 5% and 50% of the thickness of the substrate.

Based on the above, in the design of the heat dissipation structure of the disclosure, the annular groove is configured on the upper surface of the substrate. The depth of the annular groove is less than or equal to half of the thickness of the substrate, so that the stress generated by the substrate during reflow may be released. Therefore, the heat dissipation structure of the disclosure may reduce warpage during reflow, and the power module adopting the heat dissipation structure of the disclosure may effectively reduce warpage of the overall structure and improve structural reliability.

In order to make the above-mentioned features and advantages of the disclosure easier and clearer to understand, the following embodiments are given and described in details with accompanying drawings as follows.

DESCRIPTION OF THE EMBODIMENTS

Figure 1A:
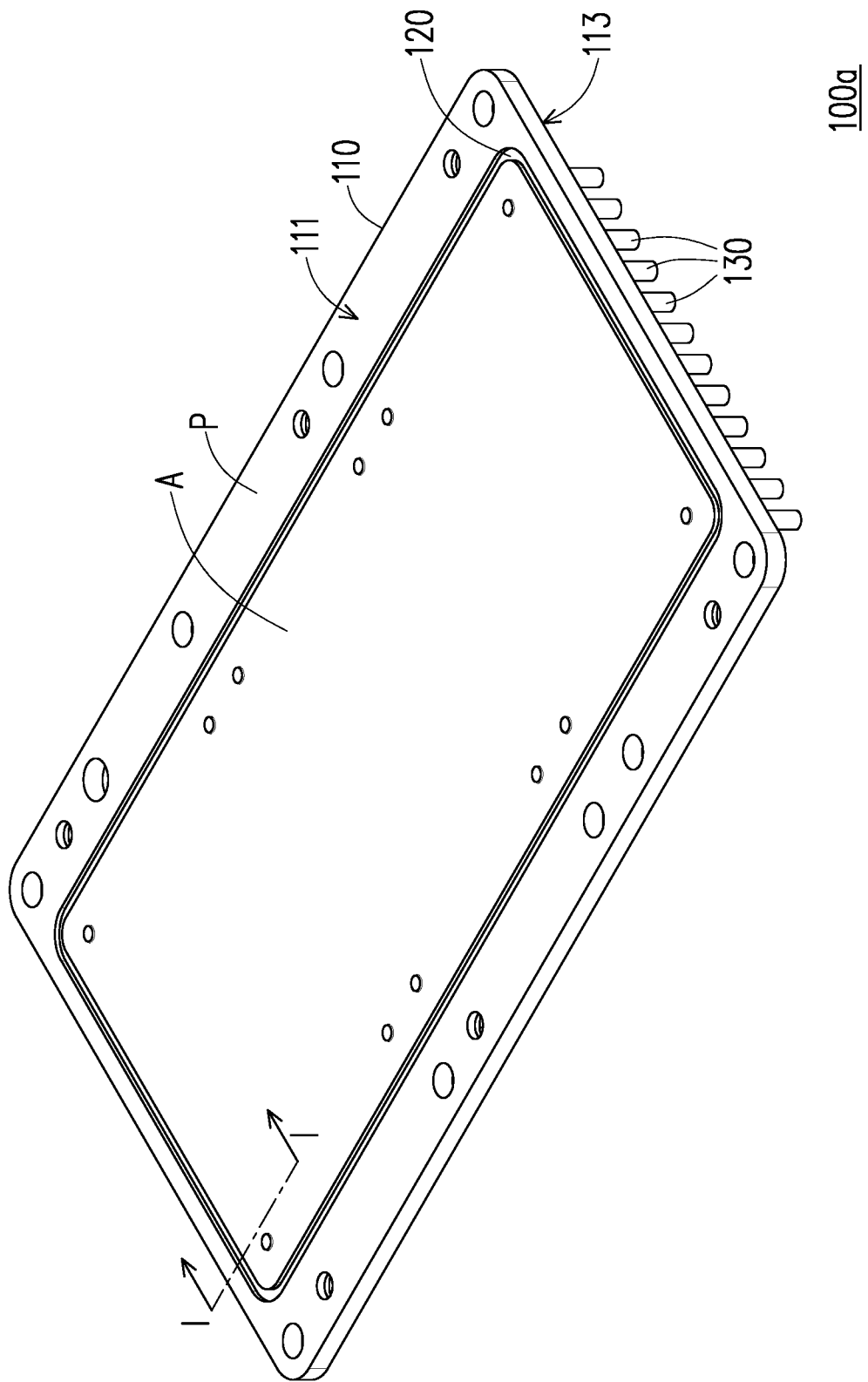
FIG. 1A is a schematic perspective view of a heat dissipation structure according to an embodiment of the disclosure.
Figure 1B:
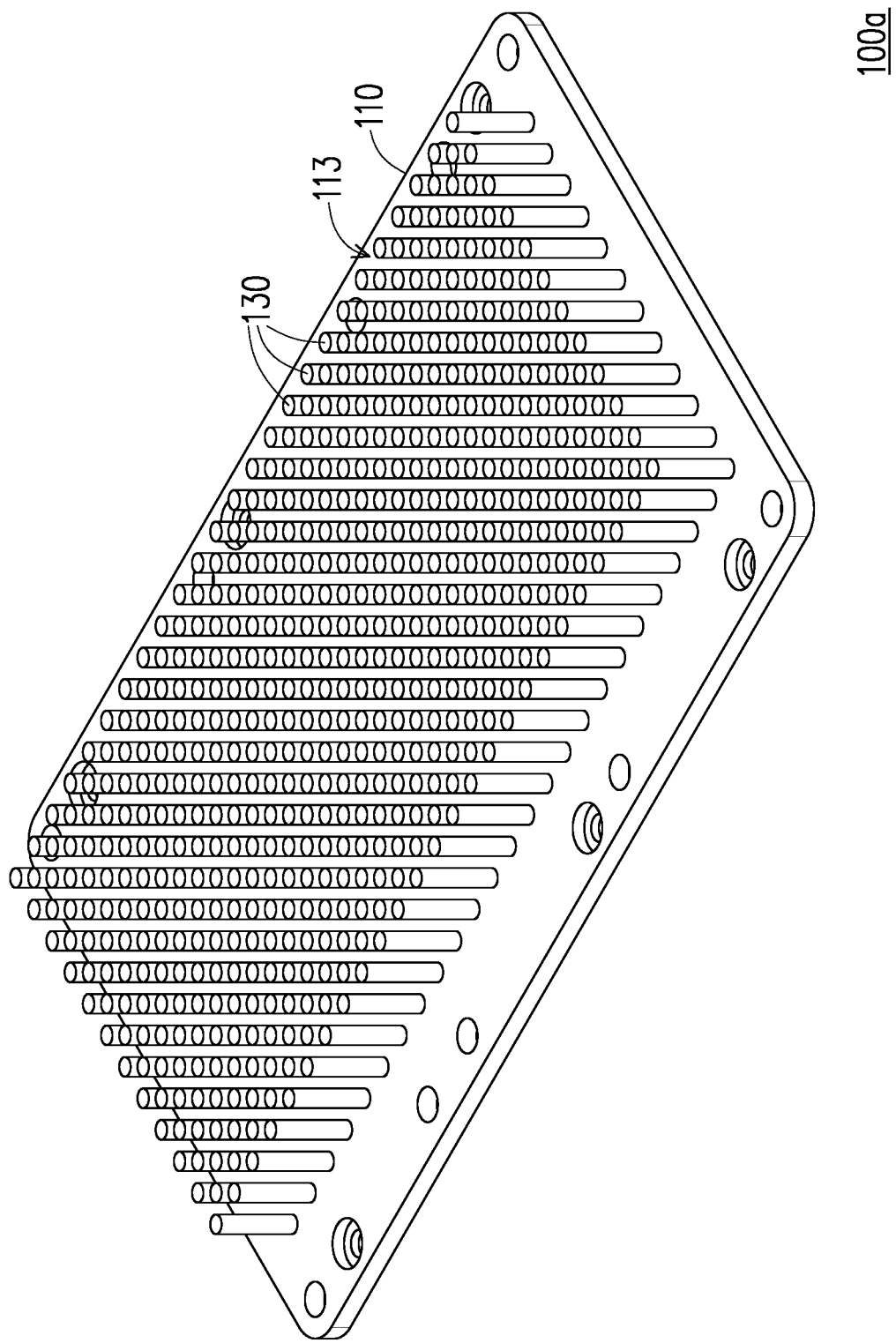
FIG. 1B is a schematic perspective view of the heat dissipation structure of FIG. 1A at another viewing angle.
Figure 1C:
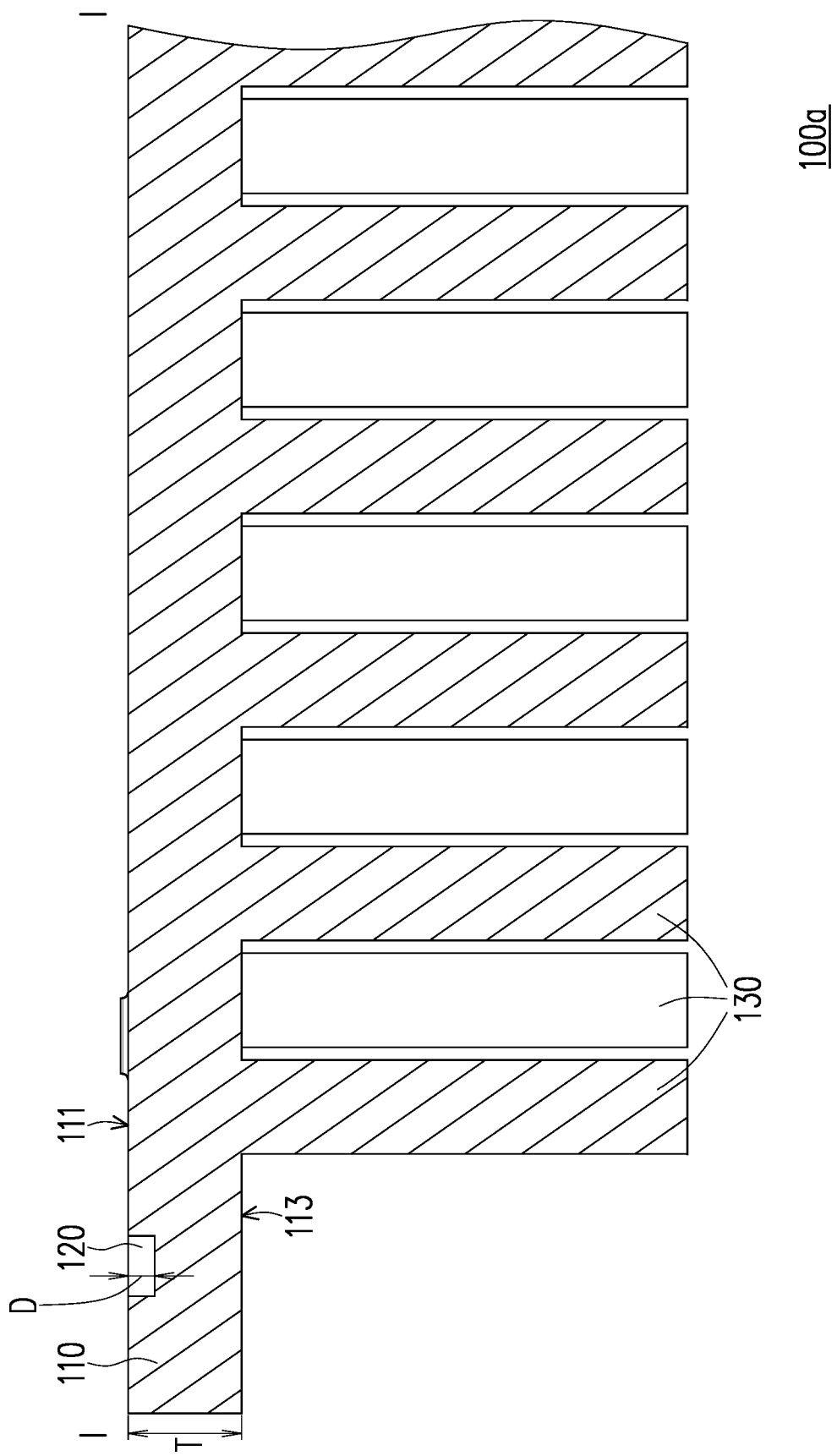
FIG. 1C is a schematic cross-sectional view along line I-I of FIG. 1A.

FIG. 1A is a schematic perspective view of a heat dissipation structure according to an embodiment of the disclosure. FIG. 1B is a schematic perspective view of the heat dissipation structure of FIG. 1A at another viewing angle. FIG. 1C is a schematic cross-sectional view along line I-I of FIG. 1A.

Please refer to FIG. 1A, FIG. 1B, and FIG. 1C at the same time. In the embodiment, a heat dissipation structure 100a includes a substrate 110 and an annular groove 120. The substrate 110 has an upper surface 111 and a lower surface 113 opposite to each other. The annular groove 120 is configured on the upper surface 111 of the substrate 110 to divide the substrate 110 into a configuration area A and a periphery area P. The annular groove 120 is located between the configuration area A and the periphery area P. A depth D of the annular groove 120 is less than or equal to half of a thickness T of the substrate 110.

In detail, in the embodiment, the material of the substrate 110 is, for example, a metal, such as copper or aluminum, but is not limited thereto. The shape of the substrate 110 is, for example, a rounded rectangle, and the shapes of the annular groove 120 and the substrate 110 are presented as disposed conformally. The annular groove 120 does not penetrate through the substrate 110, and preferably, the depth D of the annular groove 120 is between 5% and 50% of the thickness T of the substrate 110. In other words, there is a height difference between the bottom of the annular groove 120 and the upper surface 111 of the substrate 110, and the height difference is the depth D of the annular groove 120. As shown in FIG. 1B, in order to have a more favorable heat dissipation effect, the heat dissipation structure 100a of the embodiment may optionally include multiple heat dissipation fins 130 separately configured on the lower surface 113 of the substrate 110. In an embodiment, the orthographic projection of the heat dissipation fin 130 on the substrate 110 overlaps the configuration area A of the substrate 110, but it is not limited thereto. In another embodiment not shown, the heat dissipation structure may not include the heat dissipation fin and still belongs to the protection scope of the disclosure.

In short, since the annular groove 120 is configured on the upper surface 111 of the substrate 110, the depth D of the annular groove 120 is less than or equal to half of the thickness T of the substrate 110, so that the stress generated by the substrate 110 during reflow may be released. Therefore, the heat dissipation structure 100a of the embodiment may reduce warpage during reflow.

Figure 2:
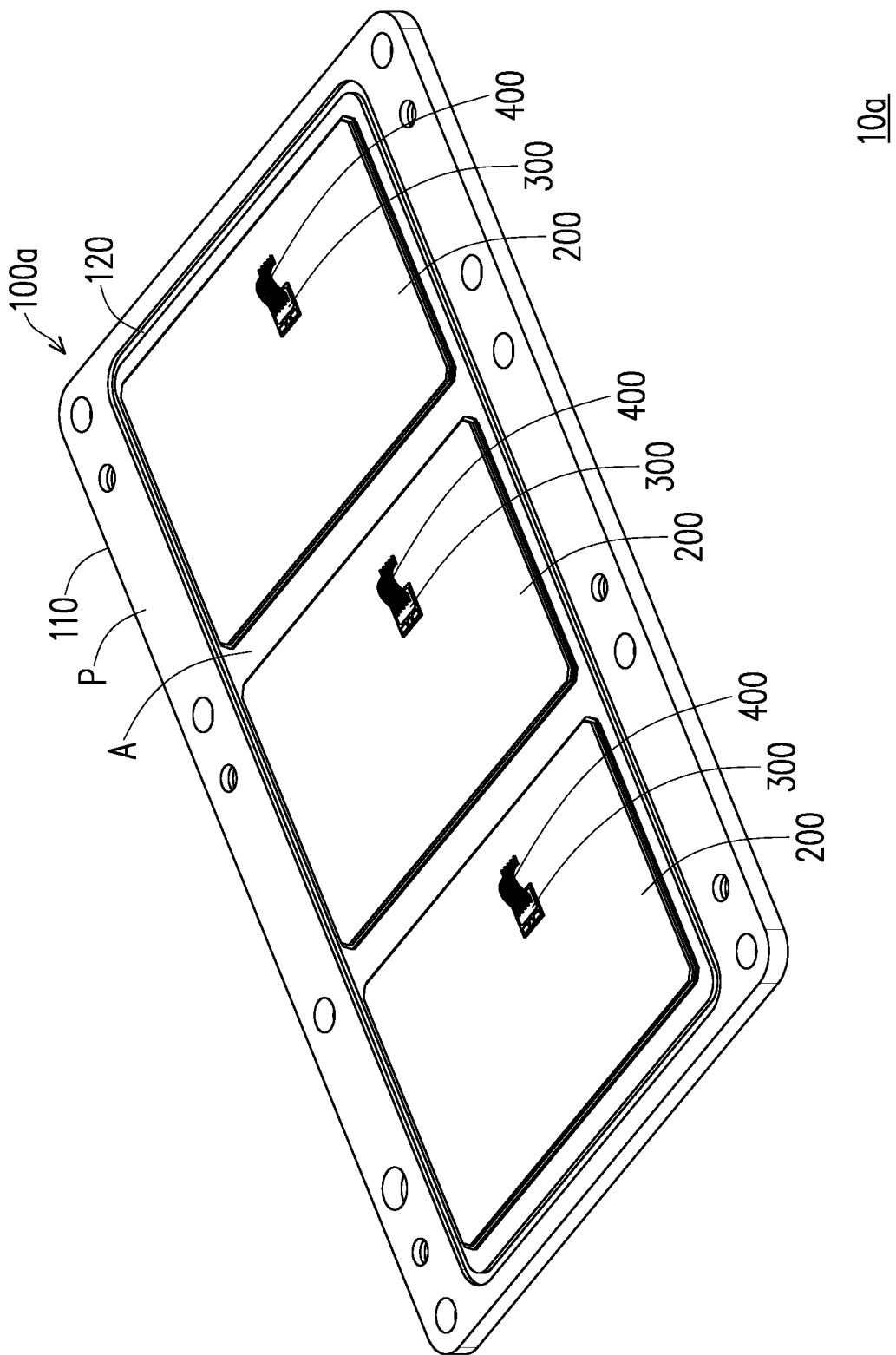
FIG. 2 is a schematic perspective view of a power module according to an embodiment of the disclosure.

FIG. 2 is a schematic perspective view of a power module according to an embodiment of the disclosure. Please refer to FIG. 2. In the embodiment, a power module 10a includes the heat dissipation structure 100a mentioned above, multiple laminate substrates 200 (three are schematically shown), and multiple chips 300 (three are schematically shown). The laminate substrates 200 are separately configured on the heat dissipation structure 100a and are located in the configuration area A of the substrate 110. The laminate substrate 200 is, for example, a direct bonded copper (DBC) substrate, but is not limited thereto. The chips 300 are respectively configured on the laminate substrates 200 and electrically connected with the laminate substrates 200, respectively. Here, the chip 300 is electrically connected with the laminate substrate 200 through, for example, a wire 400, but is not limited thereto.

Since the design of the annular groove 120 may enable the heat dissipation structure 100a of the embodiment to release the stress generated by the substrate 110 during reflow so as to reduce warpage, the power module 10a using the heat dissipation structure 100a of the embodiment may effectively reduce warpage of the overall structure and improve structural reliability.

It must be noted here that the following embodiments continues to use the referential numbers of the components and a part of the contents of the foregoing embodiments, wherein the same referential numbers are used to denote the same or similar components, and the description of the same technical content is omitted. For the description of the omitted part, reference may be made to the foregoing embodiments, and the details are not repeated here.

Figure 3:
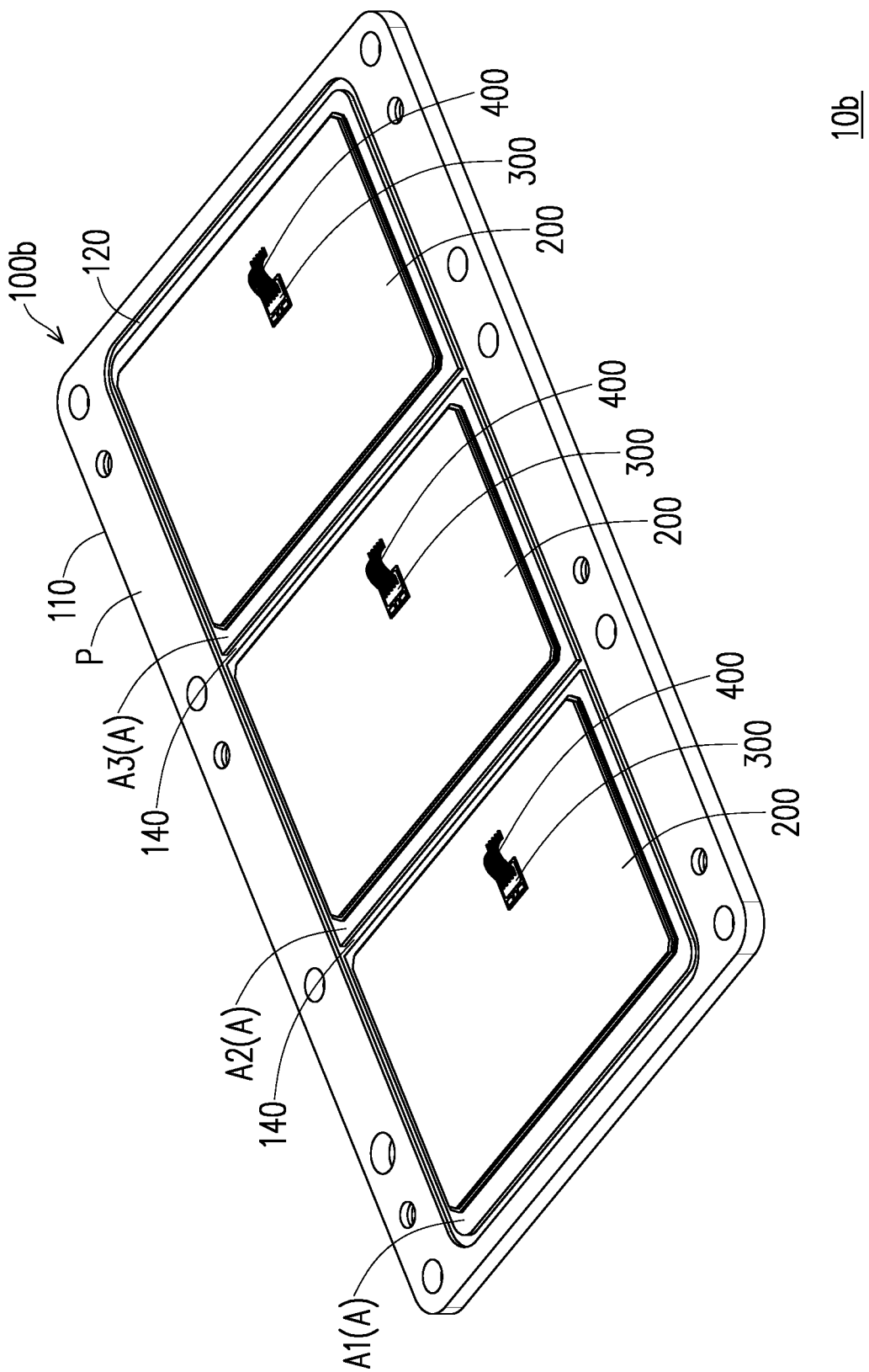
FIG. 3 is a schematic perspective view of a power module according to another embodiment of the disclosure.

FIG. 3 is a schematic perspective view of a power module according to another embodiment of the disclosure. Please refer to FIG. 2 and FIG. 3 at the same time. A power module 10b of the embodiment is similar to the power module 10a of FIG. 2. The difference between the two is that in the embodiment, a heat dissipation structure 100b further includes multiple first auxiliary grooves 140 communicating with the annular groove 120 to divide the configuration area A into at least three sub-configuration areas A1, A2, and A3. That is to say, the sub-configuration areas A1, A2, and A3 are separated by the first auxiliary groove 140. Viewed from the top, the annular groove 120 and the first auxiliary groove 140 are presented as a Mu word shape, that is, a Mu word-shaped groove. The laminate substrates 200 are respectively disposed corresponding to the sub-configuration areas A1, A2, and A3. The areas of the sub-configuration areas A1, A2, and A3 are slightly larger than the areas of the laminate substrates 200.

Since the designs of the annular groove 120 and the first auxiliary groove 140 may enable the heat dissipation structure 100b of the embodiment to release the stress generated by the substrate 110 during reflow so as to reduce warpage, the power module 10b using the heat dissipation structure 100b of the embodiment may effectively reduce warpage of the overall structure and improve structural reliability.

Figure 4:
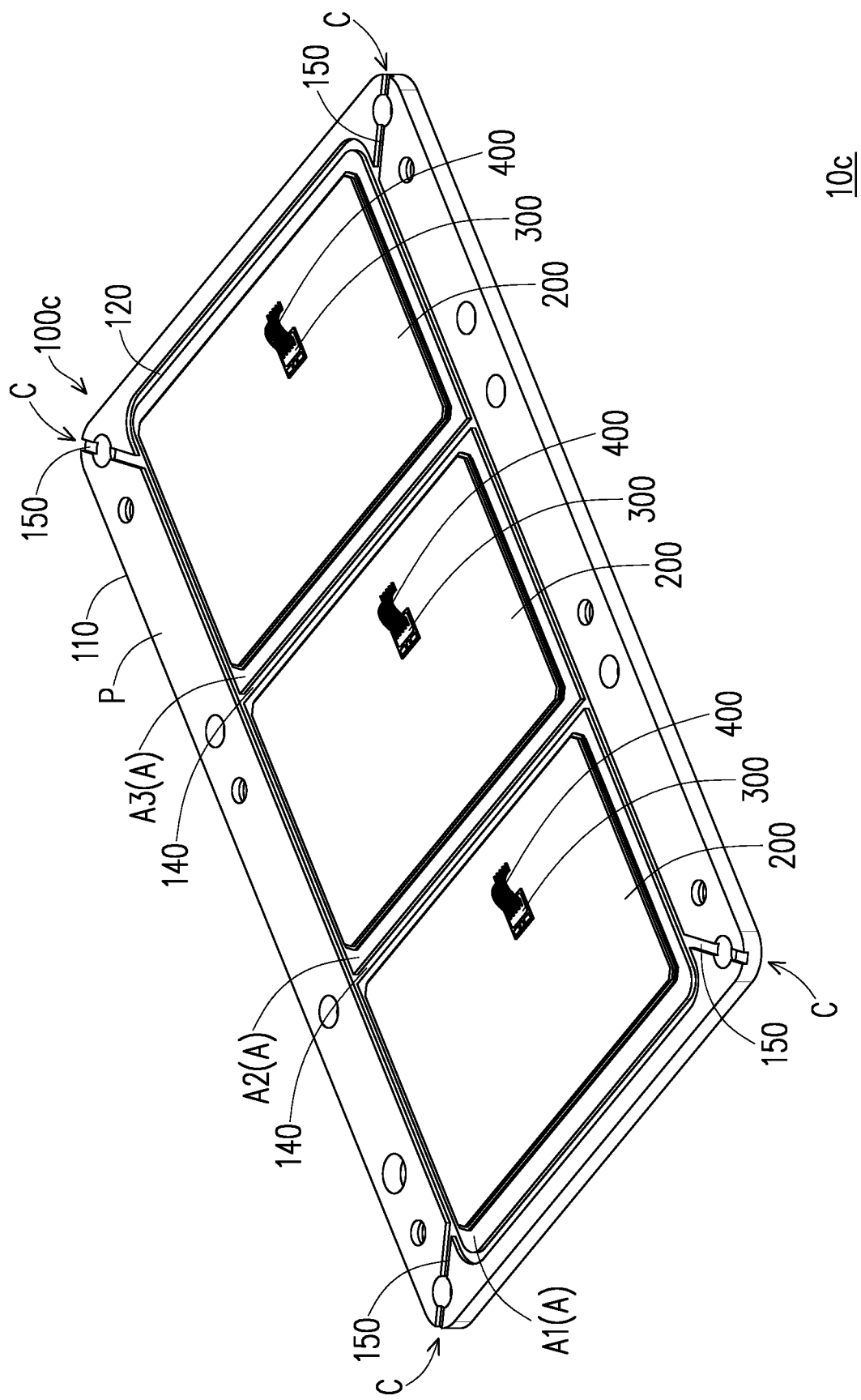
FIG. 4 is a schematic perspective view of a power module according to another embodiment of the disclosure.

FIG. 4 is a schematic perspective view of a power module according to another embodiment of the disclosure. Please refer to FIG. 3 and FIG. 4 at the same time. A power module 10c of the embodiment is similar to the power module 10b of FIG. 3. The difference between the two is that in the embodiment, a heat dissipation structure 100c further includes multiple second auxiliary grooves 150 communicating with the annular groove 120 and respectively extending to four corners C of the periphery area P. Viewed from the top, the annular groove 120 and the first auxiliary groove 140 are presented as a Mu word shape, that is, a Mu word-shaped groove, and the second auxiliary groove 150 is a four-sided groove extending to the corner C.

Since the designs of the annular groove 120, the first auxiliary groove 140, and the second auxiliary groove 150 may enable the heat dissipation structure 100c of the embodiment to release the stress generated by the substrate 110 during reflow so as to reduce warpage, the power module 10c using the heat dissipation structure 100c of the embodiment may effectively reduce warpage of the overall structure and improve structural reliability.

In summary, in the design of the heat dissipation structure of the disclosure, the annular groove is configured on the upper surface of the substrate. The depth of the annular groove is less than or equal to half of the thickness of the substrate, so that the stress generated by the substrate during reflow may be released. Therefore, the heat dissipation structure of the disclosure may reduce warpage during reflow, and the power module adopting the heat dissipation structure of the disclosure may effectively reduce warpage of the overall structure and improve structural reliability.

Although the disclosure has been described with reference to the embodiments above, the embodiments are not intended to limit the disclosure. Any person skilled in the art can make some changes and modifications without departing from the spirit and scope of the disclosure. Therefore, the scope of the disclosure will be defined in the appended claims.

What is claimed is:

1. A heat dissipation structure, comprising:
   a substrate, having an upper surface and a lower surface opposite to each other;
   an annular groove, configured on the upper surface of the substrate to divide the substrate into a configuration area and a periphery area, wherein the annular groove is located between the configuration area and the periphery area, and a depth of the annular groove is less than or equal to half of a thickness of the substrate;
   a plurality of first auxiliary grooves, communicating with the annular groove to divide the configuration area into at least three sub-configuration areas; and
   a plurality of second auxiliary grooves, communicating with the annular groove and respectively extending to four corners of the periphery area.

2. The heat dissipation structure according to claim 1, further comprising:
   a plurality of heat dissipation fins, separately configured on the lower surface of the substrate.

3. The heat dissipation structure according to claim 1, wherein the depth of the annular groove is between 5% and 50% of the thickness of the substrate.

4. A power module, comprising:
   a heat dissipation structure, comprising:
      a substrate, having an upper surface and a lower surface opposite to each other;
      an annular groove, configured on the upper surface of the substrate to divide the substrate into a configuration area and a periphery area, wherein the annular groove is located between the configuration area and the periphery area, and a depth of the annular groove is less than or equal to half of a thickness of the substrate;
      a plurality of first auxiliary grooves, communicating with the annular groove to divide the configuration area into at least three sub-configuration areas, wherein the laminate substrates are respectively disposed corresponding to the sub-configuration areas; and
      a plurality of second auxiliary grooves, communicating with the annular groove and respectively extending to four corners of the periphery area;
   a plurality of laminate substrates, configured on the heat dissipation structure, and located in the configuration area of the substrate; and
   a plurality of chips, respectively configured on the laminate substrates, and electrically connected with the laminate substrates, respectively.

5. The power module according to claim 4, wherein the heat dissipation structure further comprises:
   a plurality of heat dissipation fins, separately configured on the lower surface of the substrate.

6. The power module according to claim 4, wherein the depth of the annular groove is between 5% and 50% of the thickness of the substrate.

* * * * *